(12) United States Patent
Smith et al.

(10) Patent No.: US 7,989,024 B2
(45) Date of Patent: Aug. 2, 2011

(54) METHOD OF MAKING A LOW-RESISTIVITY, DOPED ZINC OXIDE COATED GLASS ARTICLE AND THE COATED GLASS ARTICLE MADE THEREBY

(75) Inventors: Ryan C. Smith, Collegeville, PA (US); Michael B. Abrams, Bala Cynwyd, PA (US); Roman Y. Korotkov, King of Prussia, PA (US); Gary S. Silverman, Chadds Ford, PA (US); Jeffery L. Stricker, Narberth, PA (US); Kevin David Sanderson, Wigan (GB); Liang Ye, Merseyside (GB); Guillermo Benito Gutiérrez, Ormskirk (GB)

(73) Assignees: Pilkington Group Limited, St. Helens (GB); Arkema, Inc., King of Prussia, PA (US)

( * ) Notice: Subject to any disclaimer, the term of this patent is extended or adjusted under 35 U.S.C. 154(b) by 370 days.

(21) Appl. No.: 11/800,042

(22) Filed: May 3, 2007

(65) Prior Publication Data
US 2008/0057321 A1    Mar. 6, 2008

Related U.S. Application Data

(60) Provisional application No. 60/840,783, filed on Aug. 29, 2006.

(51) Int. Cl.
*C23C 16/00* (2006.01)
(52) U.S. Cl. .................. 427/255.33; 427/248.1
(58) Field of Classification Search .................. None
See application file for complete search history.

(56) References Cited

U.S. PATENT DOCUMENTS

| | | | |
|---|---|---|---|
| 4,751,149 A | 6/1988 | Vijayakumar | |
| 4,990,286 A | 2/1991 | Gordon | |
| 5,306,522 A | 4/1994 | Clough et al. | |
| 5,407,743 A | 4/1995 | Clough et al. | |
| 6,071,561 A | 6/2000 | Gordon | |
| 6,238,738 B1* | 5/2001 | McCurdy | 427/255.19 |
| 2003/0185979 A1* | 10/2003 | Nelson | 427/248.1 |
| 2004/0018307 A1* | 1/2004 | Park et al. | 427/255.36 |
| 2005/0186342 A1* | 8/2005 | Sager et al. | 427/248.1 |
| 2006/0166512 A1* | 7/2006 | Lee et al. | 438/785 |

FOREIGN PATENT DOCUMENTS

| | | |
|---|---|---|
| EP | 1 289 025 A | 3/2003 |
| WO | WO93/13393 * | 7/1993 |
| WO | WO 2007/029014 | 3/2007 |

OTHER PUBLICATIONS

Carta, et al., Synthesis and characterization of metal oxide multilayers obtained via MOCVD, Surface and Coatings Technology, V 160, Issues 2-3, p. 124-131.*

(Continued)

*Primary Examiner* — Timothy Meeks
*Assistant Examiner* — Joseph Miller, Jr.
(74) *Attorney, Agent, or Firm* — Marshall & Melhorn, LLC

(57) ABSTRACT

What is described and claimed is an atmospheric chemical vapor deposition method of making a low-resistivity, doped zinc oxide coated glass article, made by directing one or more streams of gaseous reactants, specifically a zinc containing compound, a fluorine containing compound, an oxygen containing compound, and at least one compound containing one or more of boron, aluminum, gallium and indium onto a surface of a heated glass substrate.

11 Claims, 3 Drawing Sheets

OTHER PUBLICATIONS

Adachi, K., et al., "ZnO Films Deposited by APCVD", Proceedings of the Photovoltaic Specialists Conference—Oct. 7-11, 1991, vol. 2, Conf 22 (1991) pp. 1385-1388.

Altamirano-Juarez, D.C., et al., "Low-Resistivity ZnO:F:Al transparent thin films", Solar Energy Materials and Solar Cells, Elsevier (Amsterdam, NL), vol. 82, No. 1-2 (2004), pp. 35-43.

Choi, B.G., et al., "Electrical, optical and structural properties of transparent and conducting ZnO thin films doped with Al and F by RF magnetron sputter", Journal of the European Ceramic Society, (Elsevier (Barking, BG)), vol. 25, No. 12, (2005), pp. 2161-2165.

Hu, J., et al., "Textured aluminum-doped zinc oxide thin films from atmospheric pressure chemical vapor deposition", Journal of Applied Physics USA, vol. 17, Nos. 2 (1992), pp. 880-890.

* cited by examiner

METHOD OF MAKING A LOW-RESISTIVITY, DOPED ZINC OXIDE COATED GLASS ARTICLE AND THE COATED GLASS ARTICLE MADE THEREBY

RELATED APPLICATION

This application is claiming the benefit, under 35 U.S.C. 119(e), of the provisional application filed Aug. 29, 2006 under 35 U.S.C. 111(b), which was granted Ser. No. 60/840,783. This provisional application is hereby incorporated by reference.

BACKGROUND

The present invention is related to a method of depositing a zinc oxide coating on a transparent substrate. More particularly, it is related to a chemical vapor deposition method of depositing a zinc oxide coating on a glass substrate, which coating is modified to create a zinc oxide coating having a combination of desired properties.

Deposition of doped zinc oxide coatings has been reported in the patent literature. For example, U.S. Pat. No. 5,306,522 describes processes for coating a substrate, in particular, substrates including shielded surfaces, coated with zinc oxide containing coatings. The described processes include the elements of contacting a substrate with a zinc oxide precursor, preferably maintaining the precursor coated substrate at conditions to equilibrate the coating, then oxidizing the precursor to form a coating containing zinc oxide. The substrates coated by the process for use in various applications, are also described.

U.S. Pat. No. 5,407,743, which is related to the above-mentioned U.S. Pat. No. 5,306,522, includes additional information related particularly to the zinc oxide coated articles made by the described process.

Additionally, formation of F—, Al— doped ZnO films by a sol-gel method has been described by Castanedo-Perez, et. al. in *Solar Energy Materials & Solar Cells* 2004, 82, 35.

Durable, coated glass products are increasingly in demand. It would be desirable to have zinc oxide coated glass products exhibiting high visible light transmittance, low emissivity properties and/or solar control properties, high electrical conductivity/low sheet resistance, and which could be manufactured cost effectively.

SUMMARY OF THE INVENTION

The present invention relates to an atmospheric pressure chemical vapor deposition method of making a low-resistivity, doped zinc oxide coated glass article comprising a glass substrate heated in, for example, a float glass furnace, directing one or more streams of gaseous reactants comprising a zinc-containing compound, a fluorine-containing compound, an oxygen-containing compound, and at least one compound containing at least one of boron, aluminum, gallium, and indium, onto a surface of the heated glass substrate to deposit a doped zinc oxide coating thereon.

DETAILED DESCRIPTION OF THE INVENTION

Figure 1:
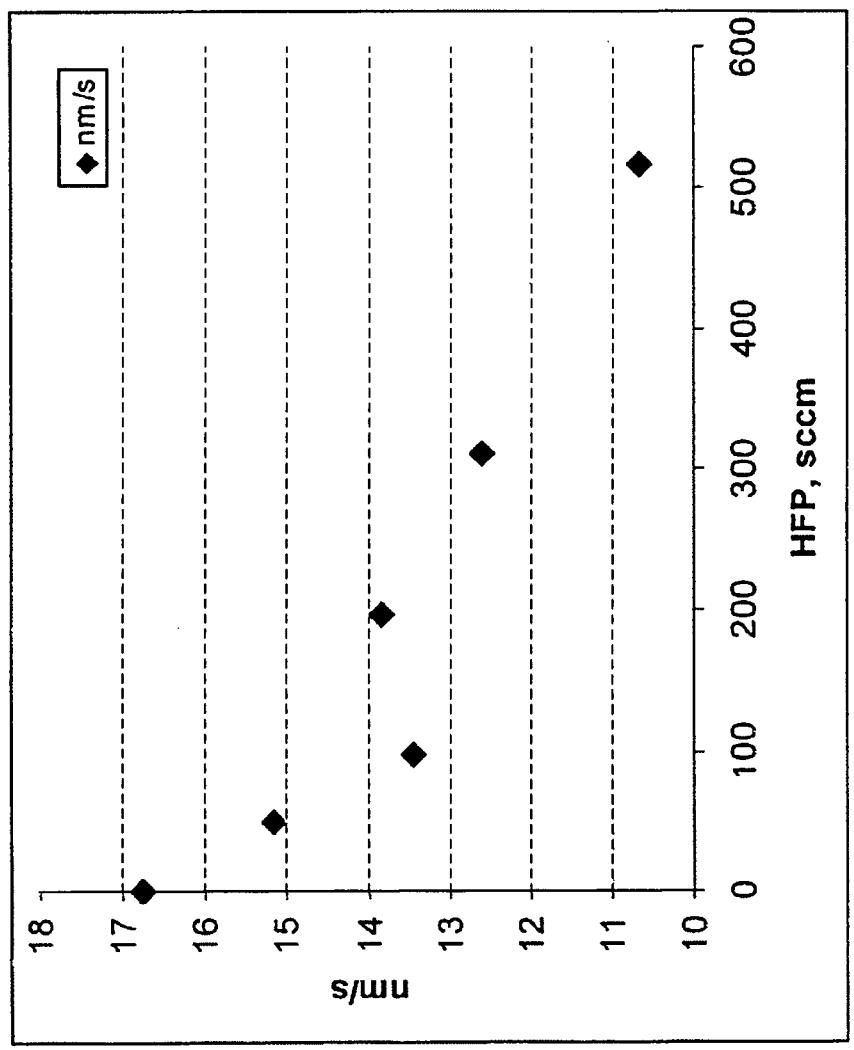
FIG. 1 is a graphical representation of hexafluoropropene (HFP) effects on deposition rate in accordance with the invention.

While zinc oxide coatings and deposition methods are known, cost effective methods of making pyrolytic zinc oxide coatings at commercially viable growth rates during the glass making process on a float glass manufacturing line have not previously been known. Further, the ability to dope such zinc oxide coatings made "on-line" with one or more dopant compounds to create coatings with a combination of desirable properties has not heretofore been achieved. The present invention overcomes the previous obstacles to making such doped zinc oxide films.

While any suitable method of atmospheric pressure chemical vapor deposition may be utilized in connection with the present invention, the method of deposition disclosed in U.S. Pat. No. 6,268,019 to Atofina Chemicals, Inc. is preferred. The '019 patent is incorporated herein by reference, in its entirety. The method of the '019 patent has been shown to be capable of depositing metal oxide films of various kinds, at commercially useful growth rates, for example, at greater than 5 nm/sec. The deposition method of the '019 patent also has the advantage of being able to vary the mixing time of the reactant materials which, in turn, allows "tuning" of the properties of, in this instance, zinc oxide coatings. In particular, the present invention demonstrates the benefits of utilizing multiple precursor compounds, which benefits will be discussed in greater detail herein.

Such doped zinc oxide coated glass products are useful as low emissivity and/or solar control layers in architectural window applications. Other potential applications of this transparent conducting oxide include: photovoltaic devices, solid state lighting (LEDs and OLEDs), induction heating, flat panel displays, touch panel screens, and transparent thin film transistors (TFT) that have applications in RFID tags and integrated circuits.

Suitable zinc containing compounds include, but are not limited to compounds of the general formula $R^1R^2Zn$, $R^1R^2ZnL$ or $R^1R^2Zn$—$[R^3R^4N(CHR^5)_n(CH_2)_m(CHR^6)_n NR^7R^8]$, where $R^{1-8}$ can be the same or different alkyl or aryl groups such as methyl, ethyl, isopropyl, n-propyl, n-butyl, sec-butyl, phenyl or substituted phenyl, and may include one or more fluorine-containing substituents, $R^5$ and $R^6$ can be H or alkyl or aryl groups, L is an oxygen-based, commercial, neutral ligand such as methyltetrahydrofuran, tetrahydrofuran, furan, diethyl or dibutyl ether, methyl tert-butyl ether or dioxane and n can be 0 or 1, and m can be 1-6 if n is 0, and m can be 0-6 if n is 1.

Suitable fluorine containing compounds include, but are not limited to: difluoromethane, 1,1-difluoroethane, 1,1,1,2-tetrafluoroethane, 1,1,1,2,2-pentafluoroethane, 1,1,1-trifluoroethane, 1,1,1,3,3-pentafluoropropane, fluoroethylene, 1,1-difluoroethylene, 1,1,1,2,3,3,3-heptafluoropropane, 1,1,1,2,2,3,3-heptafluoropropane, hexafluoropropylene, 3,3,3-trifluoropropylene, perfluorocyclopentene, perfluorobutadiene, 1,1,1,3,3,3-hexafluoro-2-propanol, 1,1,1,3,3,3-hexafluoro-2-methyl-2-propanol, hexafluoropropylene oxide, 2,2,3,4,4,4-hexafluoro-1-butanol, 1,1,2,2,3,4-hexafluoro-3,4-bis(trifluoromethyl)cyclobutane, hexafluoro-2-butyne, hexafluoroacetone, hexafluoroglutaric anhydride, trifluoroacetic anhydride, trifluoroacetyl chloride, 2,2,2-trifluoroethanol, 1,1,1-trifluoroacetone, trifluoromethane, 1,1,1-trifluoro-2-propanol, 3,3,3-trifluoropropionic acid, 3,3,3-trifluoropropyne, trifluoroamine, hydrogen fluoride, trifluoroacetic acid, 1,1,1,3,3-pentafluorobutane, 1,1,1,2,3,4,4,5,5,5-decafluoropentane Suitable oxygen containing compounds include, but are not limited to: organic acetates, for example, t-butylacetate (t-BuOAc), ethyl acetate (EtOAc), alcohols (including perfluorinated derivatives), oxygen, and water, with $H_2O$ being preferred.

Suitable group 13 metal containing precursors include those of the general formula $R^9_3ML$, or $R^9_{(3-n)}M(R^{10}C(O)CR^{11}C(O)R^{12})_n$ wherein M=one of B, Al, Ga, In or Tl, $R^9$ is an alkyl or aryl or halide or alkoxide group and may be the same or different, $R^{10-12}$ may be the same or different and are H, alkyl, or aryl groups (including cyclic and partially- and perfluorinated derivatives), L is a oxygen-based, commercial, neutral ligand such as methyltetrahydrofuran, tetrahydrofuran, furan, diethyl or dibutyl ether, methyl tert-butyl ether, or dioxane and n=0-3 and z=0-2. $Me_2Ga(acac)$ (acac=acetylacetonate), $Me_2Ga(hfac)$ (hfac=hexafluoroacetylacetonate, $F_3CC(O)CHC(O)CF_3$) and $Et_2Al(acac)$ are preferred Group 13 compounds.

An inert carrier gas, such as nitrogen, helium, or the like may also be utilized as a component of the gaseous reactant stream of the present invention.

The heated glass substrate may be formed by any suitable method, but is preferably a continuous glass ribbon formed by the well known float glass process as described in U.S. Pat. Nos. 3,356,474, 3,433,612, 3,531,274 and 3,790,361, each of which is herein incorporated by reference in its entirety.

The following non-limiting examples illustrate certain aspects of the present invention.

EXAMPLES

The APCVD apparatus used in Examples 1-6 is similar to that described in U.S. Pat. No. 6,268,019 B1. A key feature of the apparatus is the ability to control the mixing time of the gaseous reagents by feeding the vapors separately to the coating nozzle. In these experiments the coating nozzle consisted of concentric tubes: a ⅜" tube fed into a 1" tube via compression fitting that allows the length of the mixing zone to be adjusted, and an outer 1.5" tube connected to an exhaust blower for removal of by-products and unreacted vapors. The films resulting from this nozzle configuration were circular with diameter approximately 1.5".

For descriptive purposes the deposition of six examples with differing variables, but similar static deposition conditions will be described: Example 1 corresponds to deposition of zinc oxide in conjunction with aluminum-containing precursors, Example 2 corresponds to deposition of zinc oxide in conjunction with fluorine-containing precursors, and Example 3 corresponds to deposition of zinc oxide in conjunction with both fluorine and aluminum precursors. The volumetric delivery rates for all precursors were the same for each sample. Example 4 describes deposition of ZnO in conjunction with gallium precursors, while Example 5 describes deposition of ZnO in conjunction with both gallium and fluorine precursors. Example 6 describes deposition in conjunction with both fluorine and aluminum, as in Example 3, but utilizing a different zinc source, namely $Et_2Zn.TMPDA$ (TMPDA=N,N,N',N'-tetramethyl-1,3-propanediamine). For Examples 1-6, deposition was performed on static glass substrates and reactant concentrations were calculated based on the concentrations present once all streams were combined.

Example 1

Borosilicate glass (1.1 mm thick) was heated to 430° C. (measured by contact thermocouple at substrate surface) on a nickel heating block. A gas mixture of 0.08 mol % $Et_2Zn.TEEDA$ (TEEDA=N,N,N',N'-tetraethyl ethylenediamine) and 0.015 mol % $Et_2Al(acac)$ (acac=acetylacetonate) in 30 l/min nitrogen carrier gas at a temperature of 180° C. was fed through the primary chemical feed of the coating nozzle. In a separate feed, a gas mixture of 0.40 mol % water vapor (evaporated in vaporizer 1) in 2.2 l/min of nitrogen carrier gas was fed to the coater's inner tube.

The inner feed tube was adjusted such that the mixing zone was 15 cm in length. The nitrogen carrier gas flows were chosen such that the velocities of the two feeds were approximately equal. Under these conditions the face velocity at the exit of the coater nozzle was approximately 100 cm/sec, which correlates to a reactant mixing time of approximately 150 milliseconds.

The substrate was pre-dosed for 5 seconds with the water vapor gas mixture immediately prior to beginning the flow of Zn and Al precursor. Deposition time for the samples was 45 seconds and resulted in films approximately 310 nm thick. Sheet resistance for the films was 53 ohm/sq, measured by 4-point probe.

Example 2

Borosilicate glass (1.1 mm thick) was heated to 430° C. (measured by contact thermocouple at substrate surface) on a nickel heating block. A gas mixture of 0.08 mol % $Et_2Zn.TEEDA$ in 30 l/min nitrogen carrier gas at a temperature of 180° C. was fed through the primary chemical feed of the coating nozzle. In a separate feed, a gas mixture of 0.48 mol % water vapor (evaporated in vaporizer 1) and 0.82 mol % hexafluoropropene (introduced to gas stream via calibrated rotameter immediately after the vaporizer) in 2.2 l/min of nitrogen carrier gas.

The inner feed tube was adjusted such that the mixing zone was 15 cm in length. The nitrogen carrier gas flows were chosen such that the velocities of the two feeds were approximately equal. Under these conditions the face velocity at the exit of the coater nozzle was approximately 100 cm/sec, which correlates to a reactant mixing time of approximately 150 milliseconds. The substrate was pre-dosed for 5 seconds by the water vapor and hexafluoropropene gas mixture immediately prior to beginning the flow of Zn precursor to the substrate. Deposition time for the samples was 45 seconds and resulted in films approximately 340 nm thick. Sheet resistance for the films was 138 ohm/sq measured by 4-point probe.

Example 3

Borosilicate glass (1.1 mm thick) was heated to 430° C. (measured by contact thermocouple at substrate surface) on a nickel heating block. A gas mixture of 0.08 mol % $Et_2Zn.TEEDA$ and 0.015 mol % $Et_2Al(acac)$ in 30 l/min nitrogen carrier gas at a temperature of 180° C. was fed through the primary chemical feed of the coating nozzle. In a separate feed, a gas mixture of 0.48 mol % water vapor (evaporated in vaporizer 1) and 0.82 mol % hexafluoropropene (introduced to gas stream via calibrated rotameter immediately after the vaporizer) in 2.2 l/min of nitrogen carrier gas.

The inner feed tube was adjusted such that the mixing zone was 15 cm in length. The nitrogen carrier gas flows were chosen such that the velocities of the two feeds were approximately equal. Under these conditions the face velocity at the exit of the coater nozzle was approximately 100 cm/sec, which correlates to a reactant mixing time of approximately 150 milliseconds.

The substrate was pre-dosed for 5 seconds by the water vapor and hexafluoropropene gas mixture immediately prior to beginning the flow of Zn and Al precursors to the substrate. Deposition time for the samples was 45 seconds and resulted in films approximately 290 nm thick. Sheet resistance for the films was 21 ohm/sq measured by 4-point probe.

As seen in the above examples, a marked increase in conductivity was observed for Example 3 in which both fluorine and aluminum precursors were present during deposition, as compared to the other samples where aluminum and fluorine precursors were present individually.

Example 4

Borosilicate glass (1.1 mm thick) was heated to 430° C. (measured by contact thermocouple at substrate surface) on a nickel heating block. A gas mixture of 0.08 mol % $Et_2Zn.TEEDA$ and 0.003 mol % $Me_2Ga(hfac)$ in 30 l/min nitrogen carrier gas at a temperature of 180° C. was fed through the primary chemical feed of the coating nozzle. In a separate feed, a gas mixture of 0.48 mol % water vapor (evaporated in vaporizer 1) in 2.2 l/min of nitrogen carrier gas was fed to the coater's inner tube.

The inner feed tube was adjusted such that the mixing zone was 15 cm in length. The nitrogen carrier gas flows were chosen such that the velocities of the two feeds were approximately equal. Under these conditions the face velocity at the exit of the coater nozzle was approximately 100 cm/sec, which correlates to a reactant mixing time of approximately 150 milliseconds.

The substrate was pre-dosed for 5 seconds with the water vapor gas mixture immediately prior to beginning the flow of Zn and Ga precursor. Deposition time for the samples was 45 seconds and resulted in films approximately 333 nm thick. Sheet resistance for the films was 23 ohm/sq measured by 4-point probe.

Example 5

Borosilicate glass (1.1 mm thick) was heated to approximately 430° C. (measured by contact thermocouple at substrate surface) on a nickel heating block. A gas mixture of 0.08 mol % $Et_2Zn.TEEDA$ and 0.003 mol % $Me_2Ga(hfac)$ in 30 l/min nitrogen carrier gas at a temperature of 180° C. was fed through the primary chemical feed of the coating nozzle. In a separate feed, a gas mixture of 0.48 mol % water vapor (evaporated in vaporizer 1) and 0.81 mol % hexafluoropropene (introduced to gas stream via calibrated rotameter immediately after the vaporizer) in 2.2 l/min of nitrogen carrier gas.

The inner feed tube was adjusted such that the mixing zone was 15 cm in length. The nitrogen carrier gas flows were chosen such that the velocities of the two feeds were approximately equal. Under these conditions the face velocity at the exit of the coater nozzle was approximately 100 cm/sec, which correlates to a reactant mixing time of approximately 150 milliseconds.

The substrate was pre-dosed for 5 seconds by the water vapor and hexafluoropropene gas mixture immediately prior to beginning the flow of Zn and Ga precursors to the substrate. Deposition time for the samples was 45 seconds and resulted in films approximately 340 nm thick. Sheet resistance for the films was 17 ohm/sq measured by 4-point probe.

Example 6

Sodalime silica glass (0.7 mm thick) was heated to approximately 430° C. (measured by contact thermocouple at substrate surface) on a nickel heating block. A gas mixture of 0.08 mol % $Et_2Zn.TMPDA$ (TMPDA=N,N,N',N'-tetramethyl-1,3-propanediamine) and 0.003 mol % $Et_2Al(acac)$ in 30 l/min nitrogen carrier gas at a temperature of 180° C. was fed through the primary chemical feed of the coating nozzle. In a separate feed, a gas mixture of 0.48 mol % water vapor (evaporated in vaporizer 1) and 0.81 mol % hexafluoropropene (introduced to gas stream via calibrated rotameter immediately after the vaporizer) in 2.2 l/min of nitrogen carrier gas.

The inner feed tube was adjusted such that the mixing zone was 15 cm in length. The nitrogen carrier gas flows were chosen such that the velocities of the two feeds were approximately equal. Under these conditions the face velocity at the exit of the coater nozzle was approximately 100 cm/sec, which correlates to a reactant mixing time of approximately 150 milliseconds.

The substrate was pre-dosed for 5 seconds by the water vapor and hexafluoropropene gas mixture immediately prior to beginning the flow of Zn and Al precursors to the substrate. Deposition time for the samples was 40 seconds and resulted in films approximately 320 nm thick. Sheet resistance for the films was 18 ohm/sq measured by 4-point probe.

Example 7

Static Mode Coating Method

A gas mixture of 0.43 mol % of $Me_2ZnTMPDA$ in 10 slpm of nitrogen carrier gas was fed into a primary feed tube at 170° C. The first dopant was introduced into the primary feed tube from a stainless steel bubbler. The bubbler contained $Me_2Ga$ (acac) at 34.5° C. The Ga-precursor was picked up by nitrogen preheated to 60° C. at a flow rate of 430 sccm. The 197 sccm (2.5 mol %) of second dopant (hexafluoropropylene (HFP)) was added into the primary feed.

In a secondary feed tube, a gas mixture of 1.25 mol % of $H_2O$ and 3.26 mol % of 2-Butanol in 5 slpm of nitrogen was fed at 170° C. The secondary feed was simultaneously fed with the primary flow into a mixing chamber. The mixing chamber was 1¼ inch in length, corresponding to a mixing time of 278 milliseconds between the primary and secondary feed streams. The substrate used for the deposition was borosilicate glass with a thickness of 0.7 mm. The substrate was heated on a resistively heated nickel block set at 550° C. The deposition time for these films was 55 seconds in a static mode, and resulting ZnO films had thickness of 565 nm, for a deposition rate of 12 nm/sec. The haze for these films averaged 0.5% as measured by BYK HazeGuard Plus hazemeter. The resistivity, mobility and electron concentration were $2.2\times10^{-4}$ ohm-cm, 23 $cm_2/Vs$ and $1.22\times10^{21}$ $cm^{-3}$, respectively.

Examples 8-9

Utilizing Alternative Dynamic Deposition Method

The coating experiment was conducted by a dynamic coating process, in which the preheated substrates of 3 or 4 mm thick glass was moving closely at a speed of 24 inches per minute underneath a metal coater head, where the chemical mixture of gases is directed to contact a hot glass substrate at 600° C. and extracted immediately afterwards.

A gas mixture as described below was premixed in the chemical delivery trolley and fed through a heated delivery tube into the coater head. With reference to the chemical flow condition and experimental physical dimension, the reactant mixing time is calculated to be longer than one second before reaching the heated glass. The coating deposition time, defined as duration of glass passing under the effective chemical deposition region, was approximately 15 seconds. The coating processing conditions described above apply to Examples 8 and 9 below.

Example 8

Zinc Oxide from Chemistry of DEZ/IPA/$N_2$
(DEZ=diethylzinc; IPA=Isopropanol)

The coating condition is set as below

| Gas | Bubbler Temp ° C. | Flow slm |
|---|---|---|
| DEZ | 85 | 0.289 |
| N2 carrier | | 0.75 |
| IPA | 58 | 0.304 |
| N2 carrier | | 0.6 |
| N2 | | 12 |
| Total | | 13.943 |

The resulting coating of zinc oxide is about 390 nm in thickness, and the measured sheet resistance is 1.7 k ohm/sq. Compositional analysis from XPS revealed the zinc to oxygen atom ratio in the coating is approximately 1:1.

Example 9

Zinc Oxide from Chemistry of
DEZ/IPA/DEAC/HFP/$N_2$ (DEAC=$Et_2AlCl$)

The coating condition is set as below

| Gas | Bubbler Temp ° C. | Flow slm |
|---|---|---|
| DEZ | 85 | 0.289 |
| N2 carrier | | 0.75 |
| DEAC | 80 | 0.001 |
| N2 carrier | | 0.1 |
| IPA | 58 | 0.304 |
| N2 carrier | | 0.6 |
| HFP | | 0.2 |
| N2 | | 10 |
| Total | | 12.244 |

The resulting film from the Zn, Al and F premixed delivery is about 360 nm in thickness and the measured sheet resistance is 35 ohm/sq. by 4 point probe. The addition of F and Al to the gas stream has resulted in a lower sheet resistance

TABLE 1

| Example | Coating Thickness (nm) | Sheet Resistance (ohms/sq) | Film Growth Rate (A/sec) |
|---|---|---|---|
| 1 | 310 | 53 | 69 |
| 2 | 340 | 138 | 76 |
| 3 | 290 | 21 | 64 |
| 4 | 333 | 23 | 74 |
| 5 | 340 | 17 | 76 |
| 6 | 320 | 18 | 80 |
| 7 | 565 | 3.9 | 120 |
| 8 | 390 | 1700 | 260 |
| 9 | 360 | 35 | 240 |

The data in table 1 indicates a marked decrease in sheet resistance (or increase in conductivity) was observed for Example 5 and 7 in which both fluorine and gallium precursors were present during deposition as compared to Example 4 where gallium alone was present and Example 2 where fluorine alone was present. Examples 3, 6 and 9 demonstrate similar beneficial effects can be achieved when Al and F are used in comparison to Al alone (Example 1) or F alone (Example 2).

By modification of the HFP flow rate, it has been noticed that using a high HFP flow rate will noticeably reduce the coating deposition rate, while using a low HFP flow rate (such as that used in Example 8) will improve resulting coating uniformity. Based on example 7 the flow rate of HFP was varied to generate the plots in FIGS. 1-3. Based on the data in these plots one can understand that performance benefits must be balanced with the reciprocal trending deposition rate.

Figure 2:
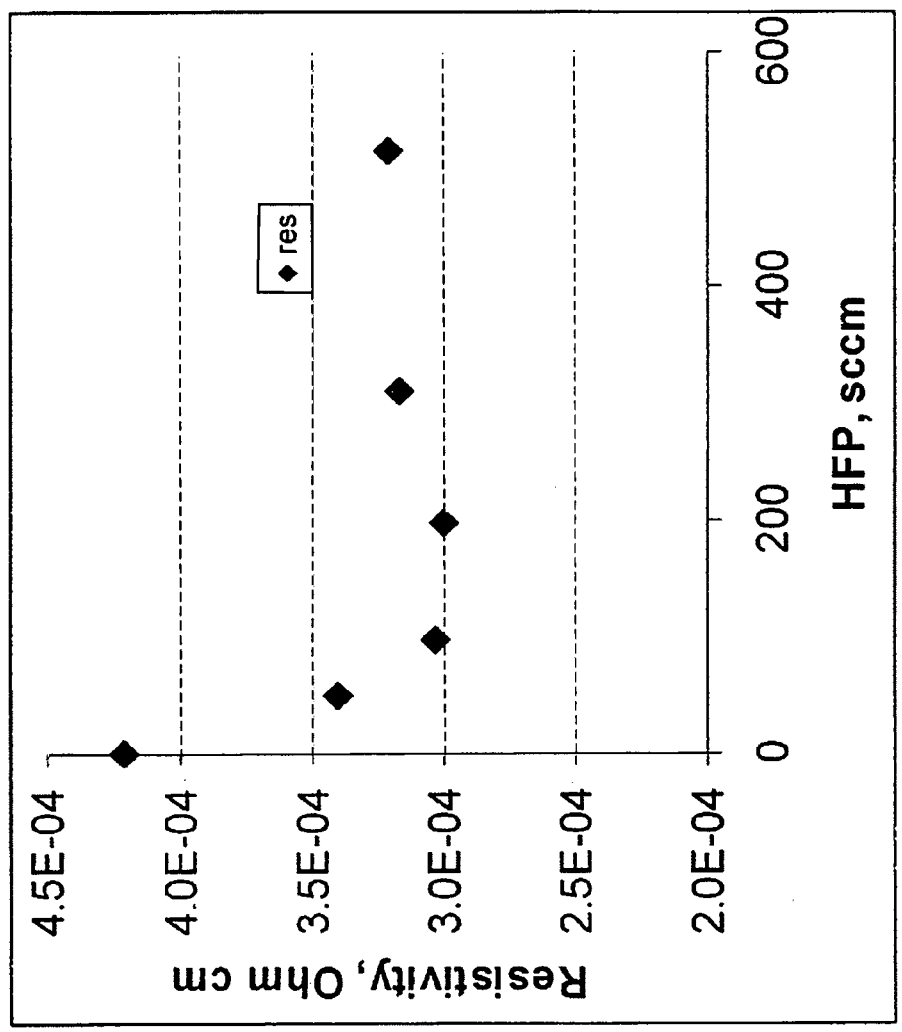
FIG. 2 is a graphical representation of hexafluoropropene (HFP) effects on resistivity in accordance with the invention.
Figure 3:
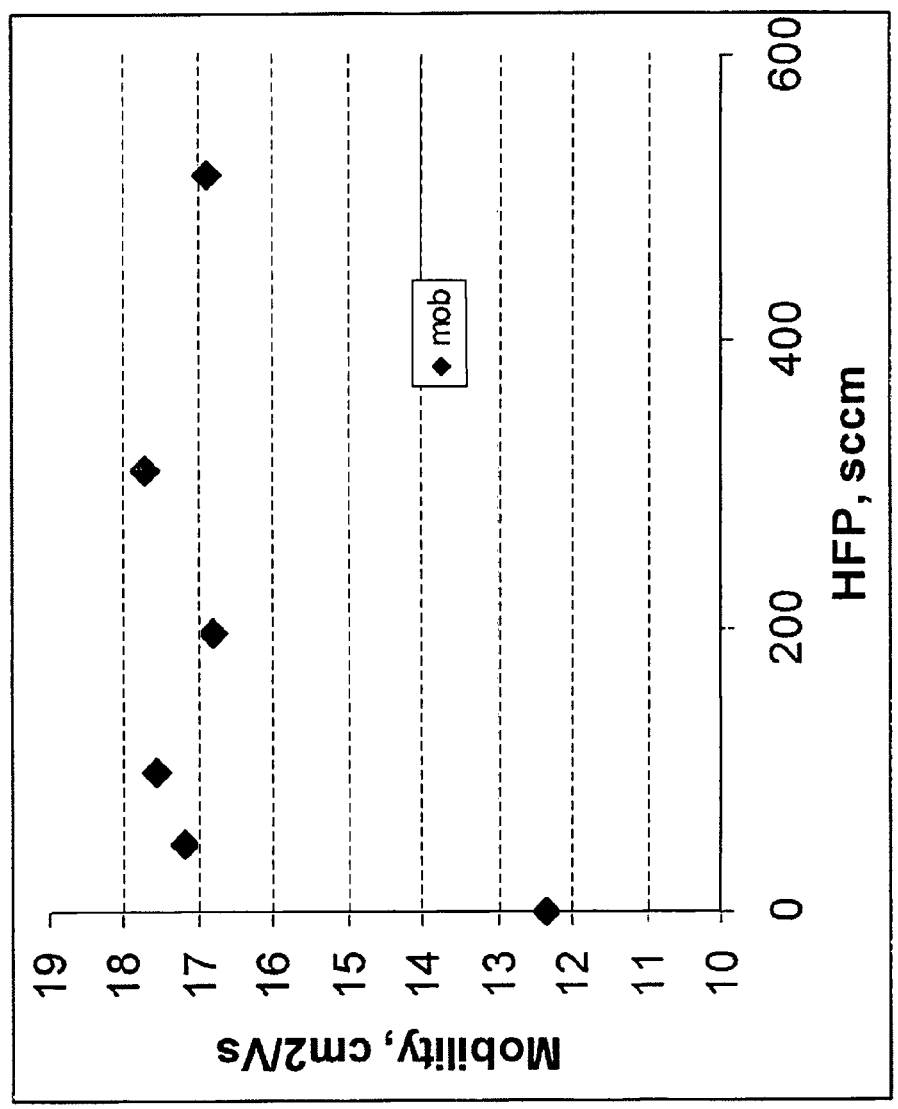
FIG. 3 is a graphical representation of hexafluoropropene (HFP) effects on mobility in accordance with the invention.

FIG. 1 shows the HFP effects on deposition rate, FIG. 2 shows the HFP effects on resistivity, and FIG. 3 shows the HFP effects on mobility.

While this invention has been described with respect to various specific examples and embodiments, it is to be understood that the invention is not limited thereto, and that it can be variously practiced within the scope of the following claims.

What is claimed is:

1. An atmospheric pressure chemical vapor deposition method of making a low-resistivity, doped zinc oxide coated glass article comprising:
   providing a moving hot glass substrate having a surface on which a coating is to be deposited, the surface being at a temperature of 400° C. or greater and atmospheric pressure;
   forming a gaseous precursor mixture comprising a zinc containing compound, a fluorine containing dopant compound, an oxygen containing compound, and at least one dopant compound containing a Group 13 element selected from boron, aluminum, gallium and indium; and
   directing the gaseous precursor mixture to the surface to deposit a doped zinc oxide coating thereon, wherein the gaseous precursor mixture is premixed for a controlled time such that the doped zinc oxide coating is deposited at a deposition rate of at least 5 nm/second.

2. The method according to claim 1, wherein the gaseous precursor mixture comprises an aluminum containing compound of the formula $R^{15}_{(3-n)}AlR^{16}_{n}L_z$ where $R^{15}$ is an alkyl or aryl or halide or alkoxide group, $R^{16}$ is an H, alkyl, aryl, halide or diketonate group with formula ($R^{17}C(O)CR^{18}C(O)R^{19}$) in which $R^{17-19}$ may be the same or different and are H, alkyl, oraryl groups (including cyclic and partially- and perfluorinated derivations), N=O-3 where L is an oxygen-containing donor ligand and where z=O-2.

3. The method according to claim 2, wherein the aluminum containing compound comprises diethylaluminum acetylacetonate.

4. The method according to claim 2, wherein the aluminum containing compound comprises diethylaluminum chloride.

5. The method according to claim 1, wherein the gaseous precursor mixture comprises a gallium containing compound of the formula $R^{15}_{(3-n)}GaR^{16}_{n}L_{z}$ wherein $R^{15}$ is an alkyl or aryl or halide or alkoxide group, $R^{16}$ is an H, alkyl, aryl, halide or diketonate group with formula $(R^{17}C(O)CR^{18}C(O)R^{19})$ in which $R^{17-19}$ may be the same or different and are H, alkyl, or aryl groups (including cyclic and partially- and perfluorinated derivatives), n=0-3, where L is an oxygen-containing donor ligand and where z=0-2.

6. The method according to claim 5, wherein the gallium containing compound comprises dimethylgallium acetylacetonate.

7. The method according to claim 5, wherein the gallium containing compound comprises dimethylgallium hexafluoroacetylacetonate.

8. The method according to claim 1, wherein the oxygen containing compound is water.

9. The method according to claim 1, wherein the oxygen containing compound is a mixture of an alcohol and water in which the concentration of water is between 0 mol % and 25% mol %.

10. The method according to claim 9, wherein the alcohol is 2-butanol.

11. The method according to claim 1, further comprising feeding the zinc containing compound, fluorine containing dopant compound, oxygen containing compound, and the at least one Group 13 containing dopant compound separately into a mixing chamber to form the gaseous precursor mixture.

* * * * *